United States Patent
Lemaitre

(10) Patent No.: US 10,707,425 B2
(45) Date of Patent: Jul. 7, 2020

(54) ORGANIC OR HYBRID ELECTRONIC DEVICE AND MANUFACTURING METHOD THEREOF

(71) Applicant: COMMISSARIAT À L'ÉNERGIE ATOMIQUE ET AUX ÉNERGIES ALTERNATIVES, Paris (FR)

(72) Inventor: Noëlla Lemaitre, Chambery (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/169,031

(22) Filed: Oct. 24, 2018

(65) Prior Publication Data
US 2019/0131545 A1    May 2, 2019

(30) Foreign Application Priority Data

Oct. 26, 2017 (FR) .................................... 17 60100

(51) Int. Cl.
*H01L 51/00* (2006.01)
*H01L 51/44* (2006.01)
*H01L 51/52* (2006.01)
*H01L 51/42* (2006.01)
*H01L 51/50* (2006.01)

(52) U.S. Cl.
CPC ...... *H01L 51/0072* (2013.01); *H01L 51/0004* (2013.01); *H01L 51/0068* (2013.01); *H01L 51/0074* (2013.01); *H01L 51/0097* (2013.01); *H01L 51/4293* (2013.01); *H01L 51/442* (2013.01); *H01L 51/5206* (2013.01); *H01L 51/5221* (2013.01); *H01L 51/5056* (2013.01); *H01L 51/5092* (2013.01); *H01L 2251/303* (2013.01); *H01L 2251/5353* (2013.01)

(58) Field of Classification Search
CPC ............... H01L 51/442; H01L 51/4293; H01L 51/0072; H01L 31/022483; H01L 31/022466
See application file for complete search history.

(56) References Cited

U.S. PATENT DOCUMENTS

2017/0054099 A1* 2/2017 Friend ................. H01L 51/5012
2017/0207405 A1* 7/2017 Lescouet ............. H01L 51/0021
(Continued)

OTHER PUBLICATIONS

Brett A.E. Courtright et al.: "Polyethylenimine Interfacial Layers in Inverted Organic Photovoltaic Devices: Effects of Ethoxylation and Molecular Weight on Efficiency and Temporal Stability", ACS Publications: Applied Materials Interfaces, 2015, 7, pp. 26167-26175.
(Continued)

*Primary Examiner* — Nicholas J Tobergte
(74) *Attorney, Agent, or Firm* — Pearne & Gordon LLP

(57) ABSTRACT

Organic or hybrid electronic device, having an NIP structure, such as an organic light-emitting diode, an organic photodetector, or an organic photovoltaic cell, comprising successively: a transparent substrate, a first transparent and electrically conducting electrode, an N type layer, an active layer comprising a polyethylenimine and: an electron donor material and an electron acceptor material, or a perovskite material, a P type layer, and a second electrode.

17 Claims, 2 Drawing Sheets

(56) References Cited

U.S. PATENT DOCUMENTS

2017/0229518 A1    8/2017  Uddin
2018/0366669 A1*  12/2018  Benwadih ........... H01L 51/4213

OTHER PUBLICATIONS

Hongkyu Kang et al.: "Simplified Tandem Polymer Solar Cells with an Ideal Self-Organized Recombination Layer", Advanced Materials, 2015, 27, pp. 1408-1413.
H. Yang et al.: "Effect of polyelectrolyte interlayer on efficiency and stability of p-i-n perovskite solar cells", Solar Energy, vol. 139, 2016, Elsevier Ltd., pp. 190-198.
Preliminary Search Report for French Patent Application No. 1760100, dated Feb. 21, 2018.

* cited by examiner

ORGANIC OR HYBRID ELECTRONIC DEVICE AND MANUFACTURING METHOD THEREOF

CROSS-REFERENCE TO RELATED APPLICATIONS

This application claims priority from French Patent Application No. 17 60100, filed Oct. 26, 2017. The content of this application is incorporated herein by reference in its entirety.

FIELD OF THE INVENTION AND STATE OF THE RELATED ART

The invention relates to the field of organic electronic devices such as organic photovoltaic cells (OPV), organic light-emitting diodes (OLED), and organic photodetectors (OPD), and the field of hybrid electronic devices, and more particularly organic or hybrid electronic devices having an NIP structure.

The invention also relates to a method for producing such organic or hybrid electronic devices.

Nowadays, the conversion efficiencies of a single-junction photovoltaic cell attain 10%. Improving not only conversion efficiencies but also the stability of photovoltaic cells is essential to be able to meet the service life requirements of commercial devices and to extend the fields of application of this technology, for example to mobile objects, IoT ("Internet of Things"), street furniture, or for building integration, etc.

To meet this dual challenge, research is particularly targeted at the study of the active materials and architectures of organic photovoltaic cells and of hybrid photovoltaic cells.

The inverted type structure (also known as NIP) was developed with the aim of enhancing the stability of the organic photovoltaic cell. It is that which makes it possible, at the present time, to attain the greatest service life for this type of device. As shown in FIG. 1A, the inverted type structure comprises a substrate 1 whereon are arranged:
- a first electrode 2 (cathode) made of a transparent electrically conducting material, also known as the bottom electrode, conventionally made of indium tin oxide (ITO),
- an N type semiconductor layer 3 known as the "Electron Injection Layer" (or EIL) or N type layer,
- an active layer 4, which has the function of absorbing photons and generating free charges, comprising at least two materials: an N type material, the electron acceptor, and a P type material, the electron donor (hole transporter); the PN type volume heterojunction is replaced by a perovskite material in the case of a hybrid photovoltaic cell,
- a P type semiconductor layer 5 known as the "Hole Transport Layer" (or HTL) or P type layer,
- a second electrode 6 (anode) made of an electrically conducting material also known as the top electrode.

The N type layer 3 may be a monolayer made of metal oxide, optionally doped, for example made of ZnO, of doped ZnO (AZO, Aluminium-doped ZnO) or of polyethylenimine (PEI) (FIG. 1A). It may also consist of a bilayer comprising, for example, a metal oxide layer 3a, such as a ZnO layer, combined with a PEI layer 3b (FIG. 1B).

For example, in the article by Jin et al. ("Highly stable and efficient inverted organic solar cells based on low-temperature solution processed PEIE and ZnO bilayers" J. Mater. Chem. A, 2016, 4, 3784), the active layer made of PTB7/$PC_{71}BM$ is coated on a polyethylenimine ethoxylated (PEIE) and ZnO bilayer.

In the article by Courtright et al. ("Polyethylenimine Interfacial Layers in Inverted Organic Photovoltaic Devices: Effects of Ethoxylation and Molecular Weight on Efficiency and Temporal Stability" ACS Appl. Mater. Interfaces 2015, 7, 26167), it was demonstrated that the performances of PBDTTT-FTTE:$PC_{70}BM$-based organic solar cells are enhanced by adding a ZnO/PEI bilayer. The increase in the molar mass of PEI from 800 to 750000 $g·mol^{-1}$ leads to a lowering of the work function of the ITO/ZnO and to an increase in the temporal stability of the devices.

However, as PEI is electrically insulating, it must be used in a very thin layer, typically of the order of 5 nm, so as to enable charge extraction while limiting series resistances. However, the control of nanometric deposition is frequently critical, which renders the method for manufacturing the cells complex. Furthermore, with such thin layers, there is a risk of forming a non-continuous layer, and therefore of there being contact between the active layer 4 and the first electrode 2, which reduces the service life of the cells.

As shown in FIG. 1C, a further solution consists of incorporating the PEI directly in the active layer 4a, 4b. This approach is, for example described in the article by Kang et al. ("Simplified Tandem Polymer Solar Cells with an Ideal Self-Organized Recombination Layer" Adv. Mater. 2015, 27, 1408) with simplified tandem structure photovoltaic cells, comprising a substrate 1, coated with a first electrode 2 made of ITO, a first active layer 4a, a P type layer 5a made of PEDOT:PSS, a second active layer 4b, a second P type layer 5b made of MoOx, a second electrode 6. To prepare the active layers 4a and 4b, a so-called PEI solution containing water and a ramiform PEI is diluted to 0.1% by mass in 2-methoxyethanol. In parallel, an active layer solution is prepared by adding PTB7-Th and $PC_{70}BM$ (1:1.5) to a chlorobenzene/1,8-diiodooctane mixture (97:3 vol %). The so-called PEI solution is added to the active layer solution with a volume ratio of 10:90. The mixture obtained is then coated by spin-coating. The PEI appears to self-organise in the active layer towards the ITO/active layer interface. The cells exhibit good conversion efficiencies. However, the method requires the use of chlorinated solvents, which renders it difficult to industrialise.

DESCRIPTION OF THE INVENTION

Consequently, one aim of the present invention is that of proposing an organic or hybrid electronic device, having an NIP structure, exhibiting a good stability and not containing a thin layer of PEI.

This aim is achieved by an organic or hybrid electronic device, having an NIP structure, comprising successively:
- a transparent substrate,
- a first transparent and electrically conducting electrode,
- an N type layer,
- an active layer comprising a polyethylenimine and
  - an electron donor material and an electron acceptor material,
  - or a perovskite material,
- a P type layer,
- a second electrode.

The organic photovoltaic cell is characterised fundamentally from the prior art by the presence both of the N type layer and by the presence of polyethylenimine (PEI) in the active layer.

The inventors demonstrated that, even if PEI, which is an electrically insulating material, is added into the active layer of a photovoltaic cell further comprising an N type layer, the photovoltaic cell exhibits a good efficiency and a very good stability.

The inventors demonstrated that the stability of the organic device according to the invention is enhanced with respect to a device having an N type layer in the form of a ZnO/PEI bilayer, or with respect to an N type layer formed from a ZnO and PEI mixture.

The term transparent denotes that the substrate and the first electrode have a transmittance greater than 70% in the visible range, i.e. from 350 nm to 750 nm, and preferably greater than 90% in the visible range.

Advantageously, polyethylenimine represents from 0.005% to 0.5%, and preferably from 0.01% to 0.1% by mass with respect to the electron donor material or with respect to the perovskite material of the active layer. Such percentages make it possible to enhance the stability of the organic electronic device, and without increasing series resistances within the device or defects which can be assimilated in recombination zones.

Advantageously, the polyethylenimine is an ethoxylated polyethylenimine.

Advantageously, the electron acceptor material is an N type polymer or soluble fullerene derivative, such as [6,6]-phenyl-$C_{61}$-butyric acid methyl ester, and the electron donor material is chosen from poly(3-hexyl)thiophene (P3HT), poly[N-9'-heptadecanyl-2,7-carbazole-alt-5,5-(4,7-di-2-thienyl-2',1',3'-benzothiadiazole] (PCDTBT), poly[[4,8-bis[(2-ethylhexyl)oxy] benzo [1,2-b:4,5-b']dithiophene-2,6-diyl][3-fluoro-2-[(2-ethylhexyl) carbonyl]thieno[3,4-b]thiophenediyl]] (PTB7), Poly([2,6'-4,8-di(5-ethylhexylthienyl)benzo[1,2-b;3,3-b]dithiophene]{3-fluoro-2[(2-ethylhexyl)carbonyl]-thieno[3,4-b]thiophenediyl}) (PTB7-Th).

Advantageously, the active layer has a thickness ranging from 100 nm to 500 nm.

Advantageously, the N type layer is made of metal oxide, preferably of ZnO, optionally doped.

Advantageously, the N type layer has a thickness ranging from 5 nm to 95 nm, and preferably from 40 nm to 50 nm. Such layers are easy to deposit compared to layers of low thicknesses (less than 5 nm). There is less risk of forming a discontinuous layer.

Advantageously, the substrate is made of glass, or of polymer, for example chosen from poly(ethylene terephthalate), polyethylene naphthalate, and cyclic olefin copolymers. The use of these materials makes it possible to produce flexible substrates. The term flexible denotes that the substrate may be pliable, i.e. that it may be bent without being damaged.

Advantageously, the organic electronic device is an organic light-emitting diode, an organic photodetector, or an organic photovoltaic cell.

Advantageously, the device has a tandem architecture, i.e. the device comprises two subassemblies, each having an inverted structure, stacked on one another according to the NIP/NIP pattern.

The invention also relates to a method for manufacturing an organic or hybrid electronic device not requiring deposition of a thin layer of PEI, that is easy to set up and transposable to a large scale.

This aim is achieved by a method for manufacturing an organic or hybrid electronic device, having an NIP structure, including at least the following successive steps:

a) providing a transparent substrate coated, successively with a first transparent and electrically conducting electrode, and with an N type layer, made of metal oxide, b) forming an active layer by deposition of a solution containing a polyethylenimine, a non-chlorinated solvent, and, an electron donor material and an electron acceptor material, or a perovskite material, followed by annealing.

The method does not require the use of chlorinated solvents and may be readily industrialised. It makes it possible to manufacture flexible organic electronic devices with an enhanced service life without needing to carry out a deposition step of a thin PEI layer which is difficult to control.

Advantageously, the active layer deposition is carried out by spin-coating, by printing or by coating.

BRIEF DESCRIPTION OF THE FIGURES

Further features and advantages of the invention will emerge more clearly from the following description and the appended figures wherein.

The various parts represented in the figures are not necessarily represented according to a uniform scale, in order to render the figures more legible.

DETAILED DESCRIPTION OF PARTICULAR EMBODIMENTS

Hereinafter, the invention will be described for a photovoltaic cell, organic or hybrid, having an NIP structure. Those skilled in the art will be able to transpose this teaching for any other organic electronic device such as an organic light-emitting diode (OLED), an organic photodetector (OPD). These electronic devices may have a tandem architecture.

Figure 1A:
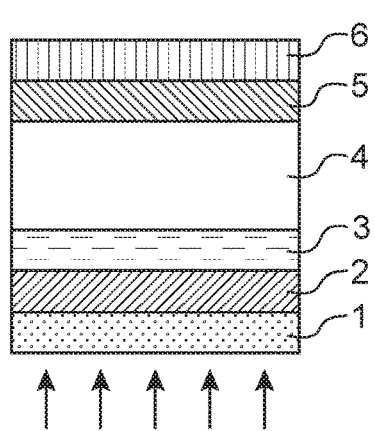
FIGS. 1A, 1B and 1C, described above, represent partial, sectional and profile, views of organic photovoltaic cells, according to the prior art.
Figure 1B:
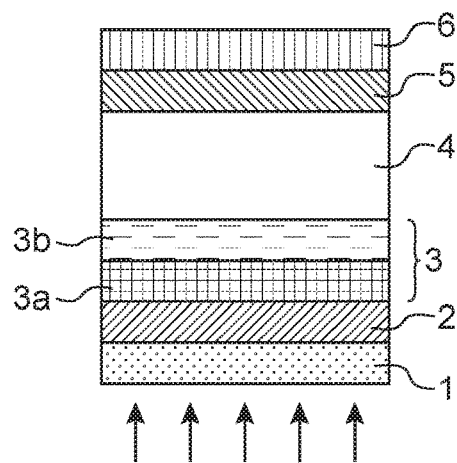
Figure 1C:
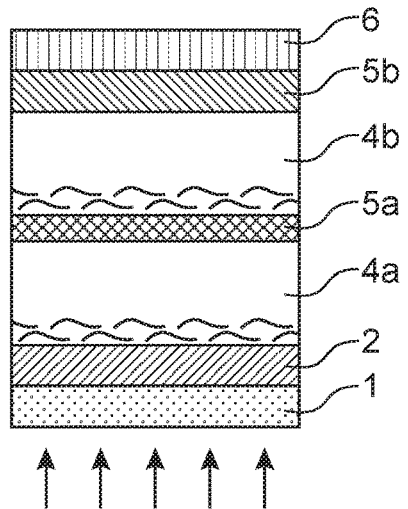
Figure 2:
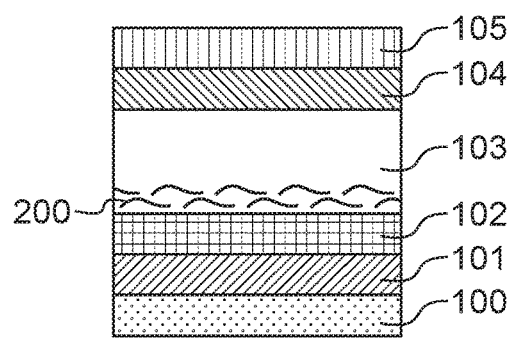
FIG. 2 represents a partial, sectional and profile, view of an organic photovoltaic cell according to a first particular embodiment of the invention.

Reference is firstly made to FIG. 2 which represents a photovoltaic cell having an NIP structure. The cell comprises successively, and preferably consists of:

a transparent substrate 100,
a first transparent and electrically conducting electrode 101,
an N type layer 102,
an active layer 103 comprising either an electron donor material and an electron acceptor material and a polyethylenimine 200 or a perovskite material and a polyethylenimine 200, a P type layer 104, a second electrically conducting electrode 105.

The substrate 100 is, preferably, flexible.

The substrate 100 is, for example, made of glass, or polymer, for example chosen from polyethylene terephthalate (PET), polyethylene naphthalate (PEN), and cyclic olefin copolymers (COC).

The substrate 100 includes two main faces parallel with respect to one another. The term parallel denotes parallel or substantially parallel.

One of the main faces is intended to receive light rays (represented by arrows), this consists of the front face. The front face is not texturised in the figures. However, to better capture the light, the front face could be texturised.

The front face of the substrate 100 is coated by the first electrode 101.

The first electrode 101, also known as the bottom electrode, is arranged between the substrate and the active layer. It must be transparent, so as to allow photons to pass through to the active layer, and electrically conducting. It may be made of transparent conducting oxide (TCO) or of a semiconductor material. This electrode may be made of indium-tin oxide (ITO), zinc oxide, aluminium-doped zinc oxide also known as AZO (ZnO:Al), or it may be formed from a transparent conducting polymer comprising silver nanowires for example.

The first electrode 101 is electrically connected to the N type layer.

The N type layer 102, also known as the electron injection layer (EIL), may be made of metal oxide, native or doped. It is, for example, made of zinc oxide (ZnO), aluminium-doped zinc oxide (ZnO:Al), titanium oxide (TiO2) or tin oxide (SnO2).

The N type layer 102 has a thickness ranging from 5 nm to 95 nm, and preferably ranging from 40 nm to 50 nm.

The cell is devoid of a thin PEI layer at the active layer/N type layer interface.

The active layer 103 absorbs the photons and generates the free charges. It has a thickness ranging, for example, from 100 nm to 500 nm.

The active layer 103 is a volume heterojunction comprising an electron donor material and an electron acceptor material.

The electron donor material is a P type material, for example a P type polymer. Among the electron donor polymers, mention may be made for example of poly(3-hexyl)thiophene (P3HT), poly[2-methoxy-5-(3,7-dimethyl-octyloxy)-1,4-phenylene-vinylene] (MDMO-PPV), or poly[N-9'-heptadecanyl-2,7-carbazole-alt-5,5-(4,7-di-2-thienyl-2',1',3'-benzothiadiazole] (PCDTBT) and PBTZT-stat-BDTT-8 (also known as PV-D4610, marketed by Merck). Among the active polymer families, mention may also be made of the PTB7 family, including PTB7-Th, or the PBDT-BDD, PDBT-T1, PPDT2FBT, PffBT4T2OD, and DT-PDPP2T-TT families.

The acceptor material is an N type material, for example, an N type polymer, graphene, semiconductor carbon nanotubes, fullerene or a mixture of fullerenes ($C_{60}$, and/or $C_{70}$ and/or $C_{84}$), or a soluble fullerene derivative such as [6,6]-phenyl-$C_{61}$-butyric acid methyl ester (PCBM).

In the case of a hybrid photovoltaic cell, the active layer includes a perovskite material acting as a volume heterojunction.

The perovskite-based active layer advantageously comprises at least one organic-inorganic hybrid perovskite material. Advantageously, perovskite is a material including 1, 2 or 3 cations and anions, for example halogens, particularly Cl, Br, I, and mixtures thereof.

The perovskite is advantageously of $ABX_3$ type (A and B representing two different cations, and X representing three halogens) wherein:

A represents advantageously at least one organoammonium ion, for example of the methylammonium (MA) or indeed formamidinium (FA) type or indeed a mixture of both, optionally associated with caesium and/or rubidium, B represents advantageously lead, tin, bismuth or antimony, X is advantageously chosen from: Cl, Br, I or a combination of these halides.

For example, perovskite may be of the $MAPbI_3$, or $MAFAPbI_3$ or $MAFACsPbI_3$ type. It may also consist of $MAPbI_{3-x}Cl_x$ where x is between 0 and 10 or $MAPbI_{3-x}Br_x$ where x is between 0 and 100.

Perovskite may be of the two-dimensional or three-dimensional type.

The perovskite-based active layer has a thickness advantageously between 50 nanometres and 1000 nanometres, more advantageously between 200 nanometres and 500 nanometres.

The active layer 103 further comprises a polyethylenimine (PEI) 200. As a general rule, the PEI may have a number average molar mass Mn ranging from 500 to 20000 g/mol, for example from 500 to 10000 g/mol.

The PEI 200 may be linear, branched or ramiform.

The branched PEI 200 comprises secondary amines. The branched PEI may have a number average molar mass Mn varying from 500 to 5000 g/mol, preferably from 1000 to 2000 g/mol, and more preferentially from 1200 g/mol to 1800 g/mol. The number average molar mass Mn represents the mean of the molar masses weighted by the number of chains of each length.

The PEI may otherwise be defined by the mass average molar mass Mw which corresponds to the mean of the molar masses weighted by the mass of chains of each length. For example, a number average molar mass Mn ranging from 1200 g/mol to 1800 g/mol corresponds to a mass average molar mass Mw ranging from 1300 g/mol to 2000 g/mol respectively.

The ramiform PEI 200 comprises primary, secondary and tertiary amines. The ramiform PEI may have a number average molar mass of the order of 10000 g/mol, corresponding to a mass average molar mass of 25000 g/mol.

According to one particular embodiment, the PEI 200 may be a polyethylenimine ethoxylated (PEIE).

Vertical segregation of the PEI 200 is assumed in the active layer 113 with a concentration gradient of PEI 200 which increases on moving towards the active layer 113/N type layer 102 interface.

The P type layer 104, also known as the hole transport layer (HTL), is made of a P type material. It consists, for example of Poly(3,4-ethylenedioxythiophene) polystyrene sulfonate (PEDOT:PSS) or of a metal oxide such a molybdenum oxide, a vanadium oxide or a tungsten oxide.

The P type layer 104 is electrically connected to the second electrode 105.

As the second electrode 105, also known as the top electrode, is positioned on the rear face, behind the active layer 103, with respect to the radiation, it may be opaque or of limited transparency, for example, made of metal. It is, for example, made of silver, gold, chromium, aluminium or of a mixture of these metals.

Figure 3:
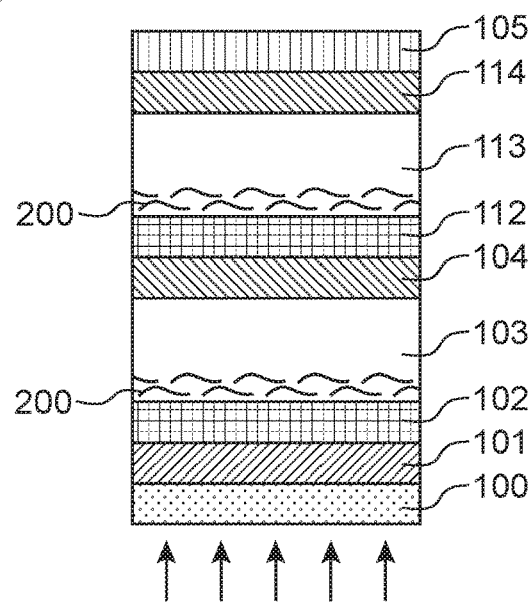
FIG. 3 represents a partial, sectional and profile, view of an organic photovoltaic cell according to a second particular embodiment of the invention.

As represented in FIG. 3, in the case of an inverted structure and tandem architecture (NIP/NIP) organic photovoltaic cell, the cell according to the invention successively comprises and, preferably, consists of:

- a transparent substrate 100,
- a first transparent and electrically conducting electrode 101,
- a first N type layer 102,
- a first active layer 103 comprising: an electron donor material, an electron acceptor material and a polyethylenimine 200,
- a first P type layer 104,
- a second N type layer 112,
- a second active layer 113 comprising: an electron donor material, an electron acceptor material and a polyethylenimine 200,
- a second P type layer 114,
- a second electrically conducting electrode 105.

The materials used to produce the tandem architecture photovoltaic cell may be the same as in the case of a single inverted structure photovoltaic cell, as described above.

The first active layer 103 and the second active layer 113 may have the same composition or different compositions. They may have the same thickness or different thicknesses. The PEI of the first active layer 103 may be identical or different to that of the second active layer 113.

The same applies for the first N type layer 102 and the second N type layer 112.

The same also applies for the first P type layer 104 and the second P type layer 114.

The conversion efficiencies of different single inverted structure OPV cells, as represented in FIG. 2, were measured. The active layer 103 of the OPV cells contains PV-D4610 marketed by Merck, PCBM and 0.01% PEI with respect to the weight of the donor polymer in a binary mixture of non-chlorinated solvents. The N type layer 102 is made of ZnO. Three PEIs were studied: two lightly branched PEIs of molar mass Mn 1200 g/mol (annotated 'Branched PEI 1' in FIG. 4) and 1800 g/mol (annotated 'Branched PEI 2') and a strongly branched PEI of molar mass Mn 10000 g/mol (annotated 'Ramiform PEI').

Figure 4:
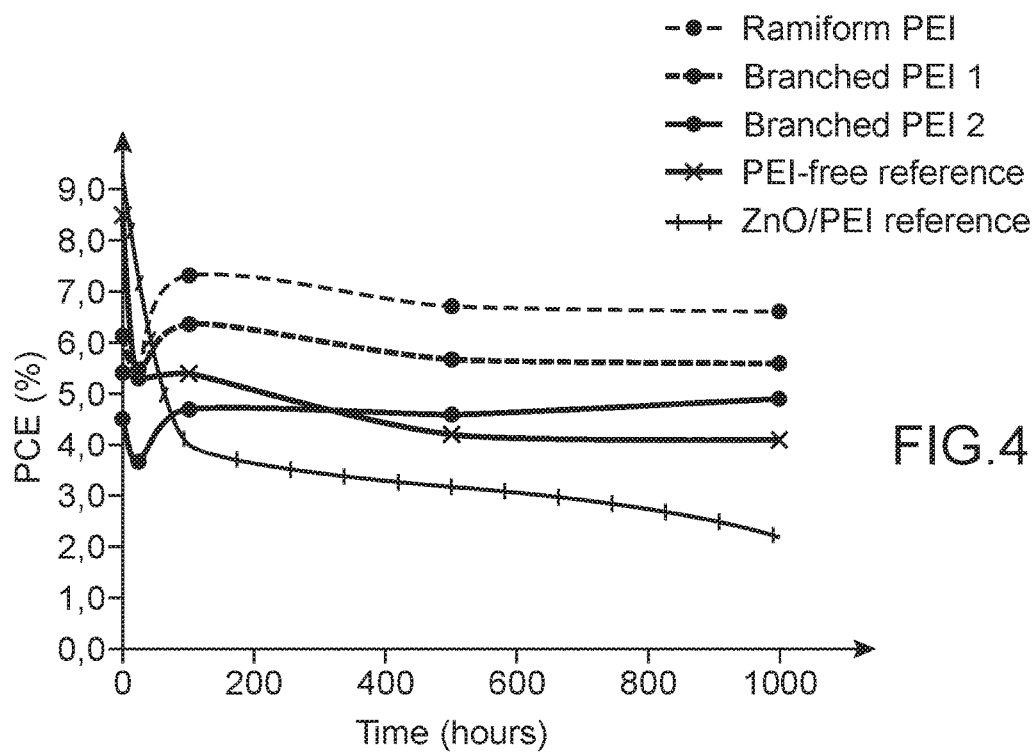
FIG. 4 represents the variation of the conversion efficiency under continuous illumination of various organic photovoltaic cells according to various embodiments of the invention, as well as a PEI-free organic photovoltaic cell and an organic photovoltaic cell having a ZnO/PEI bilayer.

The variation of the conversion efficiency of the OPV cells (active surface area=0.1256 cm$^2$) is represented in FIG. 4. The experimental conditions are as follows: continuous illumination AM1.5, power of 1000 W/m$^2$, temperature of 40° C.

The cells were compared with a reference cell which includes a ZnO layer and an active layer free from PEI (annotated 'PEI-free reference' in FIG. 4) and a cell which includes a ZnO/PEI bilayer and an active layer free from PEI (annotated 'ZnO/PEI reference'). For these reference cells, the PEI is a ramiform PEI. The PEI represents 0.01% by weight with respect to the weight of the donor polymer of the active layer.

For all the conditions of use tested, the initial performances of the cells according to the invention are lower than those of the reference cells, but they do not show any significant initial degradation unlike the reference cells. For the cells according to the invention, the photovoltaic efficiencies increase and reach a plateau above 6% on average (peak at 7.5%). This represents a 2% absolute improvement after 1000 hrs in continuous illumination compared to the PEI-free reference cell.

The results with the cell according to the invention are also superior compared to a cell having a ZnO/PEI bilayer. The concentration gradient in the active layer is favourable to stability with respect to a well-defined layer of the same material at the ZnO/active layer interface.

The conversion efficiencies of OPV cells with an N type layer formed from a PEI/ZnO mixture were also measured. The efficiencies and the intrinsic stability of the cells according to the invention is superior.

Adding PEI, branched or ramiform, into the active layer of an OPV device also having an N type layer, enhances the stability of the device with respect to the reference devices.

The invention further relates to a method for producing an organic or hybrid photovoltaic cell including at least the following successive steps:

a) providing a transparent substrate 100 coated, successively with a first transparent and electrically conducting electrode 101, and with an N type layer 102, b) forming an active layer 103 by wet process, by deposition of a solution containing a polyethylenimine 200 and a non-chlorinated solvent, and either an electron donor material and an electron acceptor material, or a perovskite material, followed by annealing, c) deposition of a P type layer 104, d) deposition of a second electrically conducting electrode 105.

The term non-chlorinated solvent denotes a non-chlorinated solvent or a mixture of a plurality of non-chlorinated solvents. The non-chlorinated solvent is, for example, chosen from o-xylene, 1-methylnaphthalene, tetralin, and mesitylene, or one of the mixtures thereof. The choice of solvent will be made according to the material(s) forming the active layer so as to enable satisfactory solubilisation of the material or of these materials.

The solution deposited in step b) may be prepared by mixing:

- a first solution comprising a non-chlorinated solvent and either the donor material and the acceptor material or the perovskite material, and
- a second solution comprising PEI, optionally hydrated, and a non-chlorinated solvent.

The deposition of the N type layer 102 and/or of the active layer 103 and/or of the P type layer 104 may be carried out at ambient temperature or at moderate temperature. The term ambient temperature denotes a temperature of 20-25° C., and the term moderate temperature denotes a temperature greater than 25° C. and up to 70° C.

The deposition of the active layer 103 and/or of the N type layer 102 and/or of the P type layer 104 may be performed by wet process. It may be, for example, carried out by any printing and/or coating technique such as ink jet deposition, screen printing, slot-die coating, spray coating, doctor blade coating, or by spin coating.

The stack may be subjected to one or a plurality of annealing steps. For example, this may consist of annealing carried out after step b) or c) or of a plurality of annealing operations carried out after each wet process layer deposition. Carrying out annealing after each wet process layer deposition enables superior drying of the various layers and/or phase microsegregation in the case of the active layer. The annealing step promotes the formation of the PEI concentration gradient in the active layer. Advantageously, an annealing step of these different layers may be carried out.

The annealing step may be carried out in a number of ways:

- rapid annealing directly at a relatively high set-point temperature but advantageously less than 150° C. and, preferably, around 120° C., annealing in multiple phases: a drying phase which may be in air or at moderate temperature (for example 50° C.) and an annealing phase at a higher temperature but, advantageously, less than 150° C. and, preferably, around 120° C.

Annealing makes it possible to evaporate the solvent it also has an impact on the morphology of the active layer.

In the case of organic devices, it makes it possible to obtain satisfactory phase segregation between the materials forming the active layer.

In the case of hybrid devices, the crystallisation of the perovskite material is enhanced, particularly by adjusting the size of the crystals.

The temperature of the heat treatment for drying the active layer ranges, for example, from 80° C. to 160° C., according to the nature of the polymer. For example, for an active layer 103 of P3HT:PCBM, the annealing temperature is 100-150° C. The annealing time may be a few minutes, for example of the order of 2 minutes.

For a tandem type architecture, the method described above comprises, between step c) and step d), successive depositions of a second N type layer 112, a second active layer 113 and a second P type layer 114.

This method is of particular interest for OPV solar cells manufactured by sheet-to-sheet or roll-to-roll methods, using ink jet printing techniques or coating, where limiting the number of deposition steps is crucial and control of very thin layers is critical, and for which the service life is primordial.

Advantageously, the method may include a subsequent step wherein the photovoltaic cell is encapsulated to be protected from external elements, particularly (water vapour and dioxygen).

The use of encapsulation is carried out by positioning the cells between two layers of so-called "gas barrier" materials or by protecting on the front face only. The gas barrier materials are conventionally dense layers (for example glass or metal panels) or multilayer films associating thin dense inorganic layers placed between organic layers. The barrier film or the rigid insulation layer (glass or metal) may be held on the cell using a pressure-sensitive adhesive, a liquid glue or a thermoplastic polymer applied by vacuum rolling for example. An example of a thermoplastic polymer is an ethylene/vinyl acetate EVA copolymer film. This encapsulating film has a thickness between, typically, 50 μm and 500 μm.

Encapsulation techniques being well-known to those skilled in the art, they will not be detailed herein.

Illustrative and Non-Limiting Example of a Method for Manufacturing an Organic Photovoltaic Cell Device By way of illustration and not limitation, an NIP type photovoltaic cell may be produced according to the following steps:

forming a first TCO electrode 101 on a PET substrate 100 of 180 μm in thickness, forming an N type layer 102, for example made of ZnO approximately 50 nm in thickness, by wet process on the top electrode 110, followed by annealing at 120° C., forming an active layer 103, by depositing a solution containing PV-D4610 and PCBM formulated in a non-chlorinated solvent mixture and comprising a linear or ramiform PEI 200, the active layer 103 having a thickness of 300 nm on the N type layer, followed by annealing at 50° C., and annealing at 120° C., forming a P type layer 104, in PEDOT:PSS type HTL, 80 nm in thickness, followed by annealing at 100° C., forming a second electrode 105, encapsulation, for example by lamination of a gas barrier film and an encapsulating agent on the front face.

Figure 5:
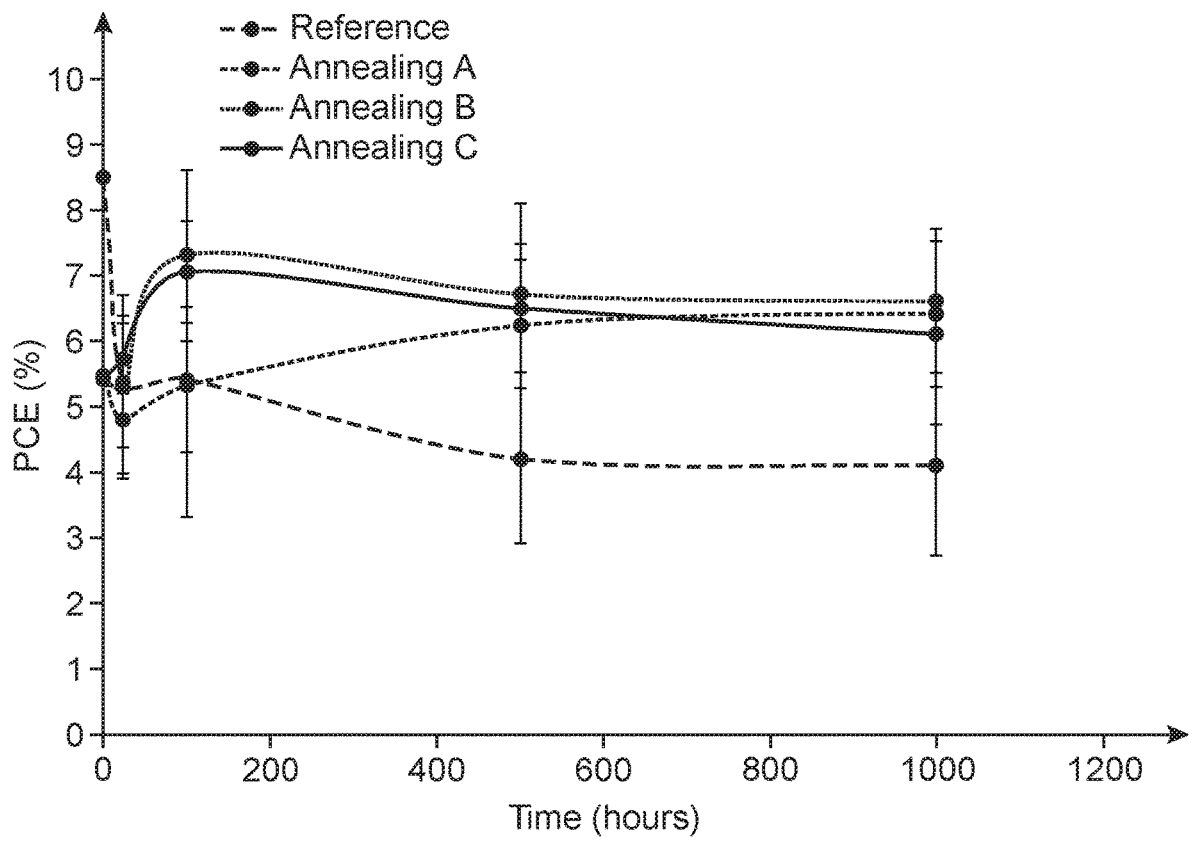
FIG. 5 represents the variation of the conversion efficiency under continuous illumination of various organic photovoltaic cells according to various embodiments of the invention, as well as a PEI-free reference organic photovoltaic cell.

FIG. 5 represents the variation of the conversion efficiency for various annealing operations. Annealing A corresponds to 2 min annealing at 120° C. Annealing B corresponds to free drying followed by 2 min annealing at 120° C. Annealing C corresponds to 2 min annealing at 50° C. followed by 2 min annealing at 120° C. The manner in which the active layer is dried has little impact on the conversion efficiency.

The invention claimed is:

1. Organic or hybrid electronic device, having an NIP structure, comprising successively:
    a transparent substrate,
    a first transparent and electrically conducting electrode,
    an N type layer,
    an active layer comprising a polyethylenimine and:
        an electron donor material and an electron acceptor material,
        or a perovskite material,
    a P type layer,
    a second electrode,
wherein the active layer has a concentration gradient of polyethylenimine that increases in a direction towards an interface of the active layer and the N type layer.

2. Electronic device according to claim 1, wherein polyethylenimine represents from 0.005% to 0.5% by mass with respect to the electron donor material or with respect to the perovskite material of the active layer.

3. Electronic device according to claim 2, wherein polyethylenimine represents from 0.01% to 0.1% by mass with respect to the electron donor material or with respect to the perovskite material of the active layer.

4. Electronic device according to claim 1, wherein the polyethylenimine is an ethoxylated polyethylenimine.

5. Electronic device according to claim 1,
    wherein the electron acceptor material is N type polymer or a soluble fullerene derivative, such as [6,6]-phenyl-C61-butyric acid methyl ester, and
    wherein the electron donor material is chosen from poly (3-hexyl)thiophene, poly[N-9'-heptadecanyl-2,7-carbazole-alt-5,5-(4,7-di-2-thienyl-2',1',3'-benzothiadiazole], poly[[4,8-bis[(2-ethylhexyl)oxy] benzo [1,2-b:4,5-b']dithiophene-2,6-diyl][3-fluoro-2-[(2-ethylhexyl) carbonyl]thieno[3,4-b]thiophenediyl]], and Poly([2,6'-4,8-di(5-ethylhexylthienyl)benzo[1,2-b;3,3-b]dithiophene]{3-fluoro-2[(2-ethylhexyl)carbonyl]thieno[3,4-b]thiophenediyl}).

6. Electronic device according to claim 1, wherein the active layer has a thickness ranging from 100 nm to 500 nm.

7. Electronic device according to claim 1, wherein the N type layer is made of metal oxide.

8. Electronic device according to claim 7, wherein the N type layer is made of ZnO.

9. Electronic device according to claim 1, wherein the N type layer has a thickness ranging from 5 nm to 95 nm.

10. Electronic device according to claim 9, wherein the N type layer has a thickness ranging from 40 nm to 50 nm.

11. Electronic device according to claim 1, wherein the substrate is made of glass, or of polymer.

12. Electronic device according to claim 11, wherein substrate is made of a material chosen from poly(ethylene terephthalate), polyethylene naphthalate, and cyclic olefin copolymers.

13. Electronic device according to claim 1, wherein the organic electronic device is an organic light-emitting diode, an organic photodetector, or an organic photovoltaic cell.

14. Electronic device according to claim 1, wherein the device has a tandem architecture.

15. Method for manufacturing an organic or hybrid electronic device, having an NIP structure, including at least the following successive steps:
  a) providing a transparent substrate coated, successively with a first transparent and electrically conducting electrode, and with an N type layer,
  b) forming an active layer by deposition of a solution containing a polyethylenimine, a non-chlorinated solvent, and, an electron donor material and an electron acceptor material, or a perovskite material, followed by annealing.

16. Method according to claim 15, wherein the deposition of the active layer is carried out by spin-coating, by printing or by coating.

17. Organic or hybrid electronic device, having an NIP structure, comprising successively:
  a transparent substrate,
  a first transparent and electrically conducting electrode,
  an N type layer,
  an active layer comprising a polyethylenimine and:
    an electron donor material and an electron acceptor material,
    or a perovskite material,
  a P type layer,
  a second electrode,
wherein the polyethylenimine in the active layer is intermixed with the electron donor material and an electron acceptor material, or the perovskite material; and wherein the electronic device is devoid of a separate polyethylenimine layer at an interface of the active layer and the N type layer.

* * * * *